United States Patent
Barnes

(10) Patent No.: US 6,268,747 B1
(45) Date of Patent: Jul. 31, 2001

(54) DYNAMIC VOLTAGE SENSE AMPLIFIER

(75) Inventor: William Barnes, Bristol (GB)

(73) Assignee: STMicroelectronics Limited, Almondsbury Bristol (GB)

( * ) Notice: Subject to any disclaimer, the term of this patent is extended or adjusted under 35 U.S.C. 154(b) by 0 days.

(21) Appl. No.: 09/489,684

(22) Filed: Jan. 24, 2000

(30) Foreign Application Priority Data

Jan. 27, 1999 (GB) .................................................. 9901830

(51) Int. Cl.$^7$ .............................. G01R 19/00; G11C 7/00; H03F 3/45
(52) U.S. Cl. ................................ 327/55; 327/57; 327/64
(58) Field of Search ........................ 327/51, 52, 54–57, 327/64, 65, 67, 53, 66, 69, 70

(56) References Cited

U.S. PATENT DOCUMENTS

| | | | |
|---|---|---|---|
| 4,169,233 | * | 9/1979 | Haraszi ................................. 327/257 |
| 5,029,136 | * | 7/1991 | Tran et al. ............................ 365/205 |
| 5,083,295 | * | 1/1992 | Lammerts et al. ..................... 327/51 |
| 5,111,078 | * | 5/1992 | Miyamoto et al. .................... 327/51 |
| 5,226,014 | | 7/1993 | McManus ............................. 365/210 |
| 5,304,874 | * | 4/1994 | Vinal ..................................... 327/55 |
| 5,343,433 | | 8/1994 | Duvvury et al. ...................... 365/205 |
| 5,363,001 | * | 11/1994 | Vinal ..................................... 327/55 |
| 5,391,949 | * | 2/1995 | Vinal ..................................... 327/53 |
| 5,508,644 | * | 4/1996 | Branson et al. ....................... 327/57 |
| 5,537,066 | * | 7/1996 | Kawashima ........................... 327/55 |
| 5,539,353 | | 7/1996 | Kajimoto et al. ..................... 327/538 |
| 5,552,728 | * | 9/1996 | Lin ........................................ 327/57 |
| 5,563,835 | * | 10/1996 | Oldham ................................. 327/52 |
| 5,565,799 | * | 10/1996 | Houston ................................ 327/52 |
| 5,627,789 | * | 5/1997 | Kalb, Jr. ............................... 365/205 |
| 5,715,198 | | 2/1998 | Braceras et al. ................. 365/189.03 |
| 5,761,124 | * | 6/1998 | Sato et al. ........................ 365/185.22 |
| 6,008,673 | * | 12/1999 | Glass et al. ........................... 327/55 |
| 6,130,560 | * | 10/2000 | Sato ...................................... 327/57 |

FOREIGN PATENT DOCUMENTS 0 220 721   5/1987 (EP) .

* cited by examiner

Primary Examiner—Terry D. Cunningham
Assistant Examiner—Long Nguyen
(74) Attorney, Agent, or Firm—Wolf, Greenfield & Sacks, P.C.; James H. Morris; Theodore E. Galanthay

(57) ABSTRACT

A sense amplifier includes a bistable circuit and a control circuit. The bistable circuit has first and second input/output terminals connected to two input lines via a gating circuit. The bistable circuit has positive and negative supply nodes, one of which is connected to the output of the control circuit. An inverter is connected from the control circuit output to the gating circuit so that the control circuit activates the bistable circuit at all times except when the gating circuit connects the input/output terminals to the input lines.

9 Claims, 3 Drawing Sheets

DYNAMIC VOLTAGE SENSE AMPLIFIER

FIELD OF THE INVENTION

The invention relates to a sense amplifier suitable for evaluating data stored in a matrix memory, and more particularly to a dynamic sense amplifier.

BACKGROUND OF THE INVENTION

Semiconductor memory arrays are conventionally classified into two types, namely read only memories (ROM) and random access memories (RAM) Random access memories are themselves sub-classified into two main types, namely static memories (SRAM) and dynamic memories (DRAM).

A majority of memory arrays of all types require the use of a so-called sense amplifier which responds either to the difference in potential on two complementary bit lines, or occasionally the difference between the potential on a single bit line and that on a reference bit line to evaluate the content of a particular memory location. Again, such sense amplifiers are classifiable into two types, namely static sense amplifiers—in which a direct current path exists between positive and negative supply terminals—and dynamic sense amplifiers—in which only transient paths exist for current flow.

As is known to those skilled in the art, evaluation of memory content usually takes place at specific instance of time related to a clock cycle in the system and the value which is sensed must be retained for a substantial period of time after such evaluation to allow for circuitry downstream of the memory to receive, and act upon, the correct values.

In conventional dynamic sense amplifiers a latch is provided, conventionally of cross-coupled NAND gates, to store the last value sensed by the sense amplifier until the time comes for a new value to be sensed and output to the latch.

Such an arrangement is wasteful of chip area and also slows down the performance of the memory since allowance must be made for two gate delays before the output has achieved a stable level.

It is accordingly an object of the present invention to provide a dynamic sense amplifier which at least partially mitigates the difficulties of the prior art.

It is a secondary object of the invention to provide a dynamic sense amplifier having an output which is capable of being rendered high impedance, thus adopting a tristate condition so as to avoid affecting downstream circuit elements.

SUMMARY OF THE INVENTION

According to a first aspect of the present invention there is provided a sense amplifier circuit for sensing a potential difference between two input lines, and for adopting a first or second logic state in response to said potential difference being respectively positive or negative, the sense amplifier comprising a bistable circuit and a control circuit wherein the bistable circuit has a first and a second signal terminal connectable to the input lines, said first and second signal terminals constituting first and second output terminals of the sense amplifier said bistable circuit having a connection to one of a positive and negative supply and wherein said control circuit is operable in use to connect said bistable circuit to the other of said negative and positive supplies for operation thereof.

Preferably the sense amplifier further comprises a gating circuit connected between said input lines and the first and second signal terminals, said gating circuit having a control input for interrupting said connection.

Advantageously the control circuit has a control input for connecting said other of said negative and positive supplies for operation of said bistable circuit.

Conveniently said sense amplifier circuit further comprises a delaying inverter circuit connecting said control input of said control circuit to said control input of said gating circuit.

Preferably the bistable circuitry comprises a pair of cross-coupled CMOS inverters.

Advantageously the CMOS inverters comprise respective PMOS transistors having a connection to a positive supply rail and NMOS transistors having a connection to said control circuit for providing a negative supply thereto.

According to a second aspect of the present invention there is provided a method of operating a sense amplifier comprising:

connecting a sensing circuit to two input lines, whereby differential voltage on said input lines propagates to said sensing circuit;

disconnecting said input lines from said sensing circuit;

connecting said sensing circuit to a power supply whereby said sensing circuit latches; and maintaining said connection to said power supply thereafter;

wherein said power supply remains connected to said sensing circuit substantially at all times except when said input lines are connected to the sensing circuit.

Preferably said step of connecting said sensing circuit to a power supply is started before starting said step of disconnecting said input lines from said sensing circuit.

BRIEF DESCRIPTION OF THE DRAWINGS

The present invention will now be described with reference to the accompanying drawings in which.

DESCRIPTION OF PREFERRED EMBODIMENTS

Figure 1:
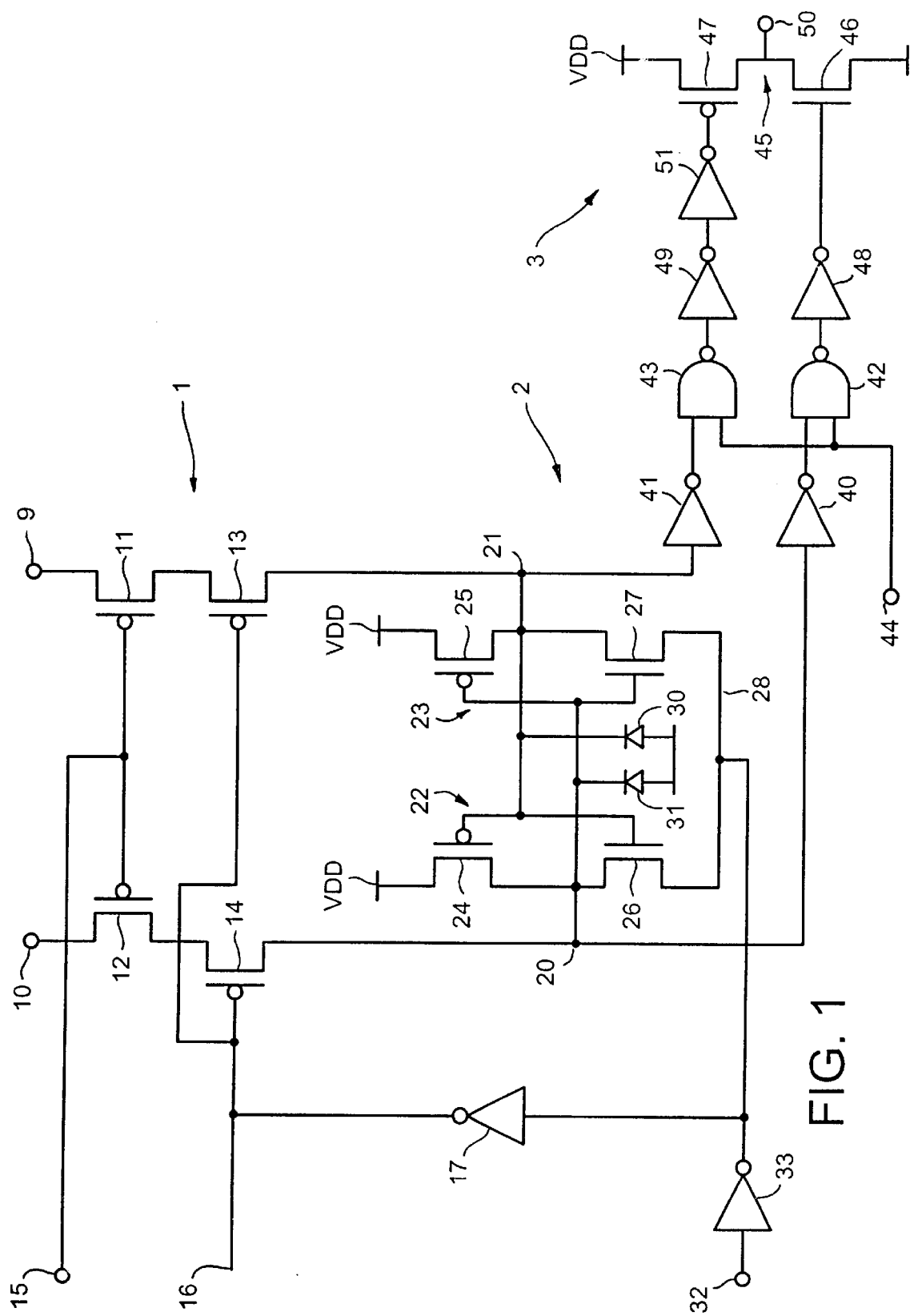
FIG. 1 shows a schematic diagram of a first embodiment of a sense amplifier in accordance with the invention.

In the various figures like reference numerals refer to like parts.

Referring now to FIG. 1 the sense amplifier circuit consists of three parts namely gating circuitry 1, bistable circuitry 2 and output circuitry 3.

The gating circuitry 1 has two input terminals 10 and 9 which in use are connected to a pair of complementary bit lines of a matrix memory array. The first input terminal is connected via the series-connected current paths of a first p-type transistor 12 and a second p-type transistor 14 to a node 20 which forms an input/output node of the bistable circuitry 2. Similarly the second input terminal 9 is connected via the series-connected main current paths of a third p-type transistor 11 and a fourth p-type transistor 13 to an out node 21 which forms a second input-output node of the bistable circuitry 2. The control gates of the first and third transistors 11, 12 are connected together and to a first control terminal 15 while the control gates of the second and fourth p-type transistors 13, 14 are connected together and to a second control terminal 16.

The bistable circuitry 2 has, as has previously been discussed, two input/output nodes 20 and 21. Connected between these terminals is a pair of cross-coupled CMOS inverters 22, 23 each consisting of a p-type and n-type transistor.

The first CMOS inverter 22 has a first upper p-type transistor 24 and a second lower n-type transistor 26 connected in series at the first input/output node 20 and the second inverter 23 has a second upper p-type transistor 25 and a second lower n-type transistor 27, these transistors being connected in series at the second input/output node 21. The control gates of the first p-type upper transistor 24 and of the first n-type lower transistor 26 are connected together, and to the second input/output node terminal 21 whereas the control gates of the second upper p-type transistor 25 and the second n-type lower transistor 27 are connected together and to the first input/output node 20. The first and second upper p-type transistors have their third electrode connected to a positive supply rail VDD and the first and second lower n-type transistors have their third electrode connected to a common tail node 28. The commoned gates of the first upper and first lower transistors 24 and 26 are connected to a reference potential via a first diode 30 and the commoned gates of the second upper and second lower transistors 25, 27 are connected to the reference potential via a second diode 31. Both diodes are connected with their anodes to the reference potential and their cathodes to the respective common gate to provide electrostatic discharge protection.

A third control input 32 is connected to the common tail node 28 of the first and second lower transistors 26 and 27 via a first inverter 33. The output terminal of the inverter 33 is connected via a second inverter 17 to the second control terminal 16.

The output circuitry 3 consists of a first inverter 40 connected with its input to the first input/output node 20 of the bistable circuitry 2 and a corresponding second inverter 41 connected with its input to the second input/output node 21 of the bistable circuitry 2. The output terminal of the first inverter 40 is connected to one input of a first NAND gate 42 and that of the second inverter to a corresponding second NAND gate 43. A fourth control input terminal 44 connects to the second input terminals of the first and second two-input NAND gates 42 and 43. The output terminals of the NAND gates are connected to respective inputs of a CMOS output inverter 45 which consists of a n-type transistor 46 having its main current path between a reference potential and an output node 50 and its control gate connected to the output of the first NAND gate 42 via a third inverter 48. The inverter 45 further has a p-type transistor 47 connected between a positive supply rail VDD and the output node 50, the control gate of the p-type transistor 47 being connected to the output of the second NAND gate 43 via the series connection of a fourth inverter 49 and a fifth inverter 51.

Operation of the sense amplifier circuit shown in FIG. 1 will now be described with further reference to the wave forms shown in FIGS. 2a–d.

Figure 2:
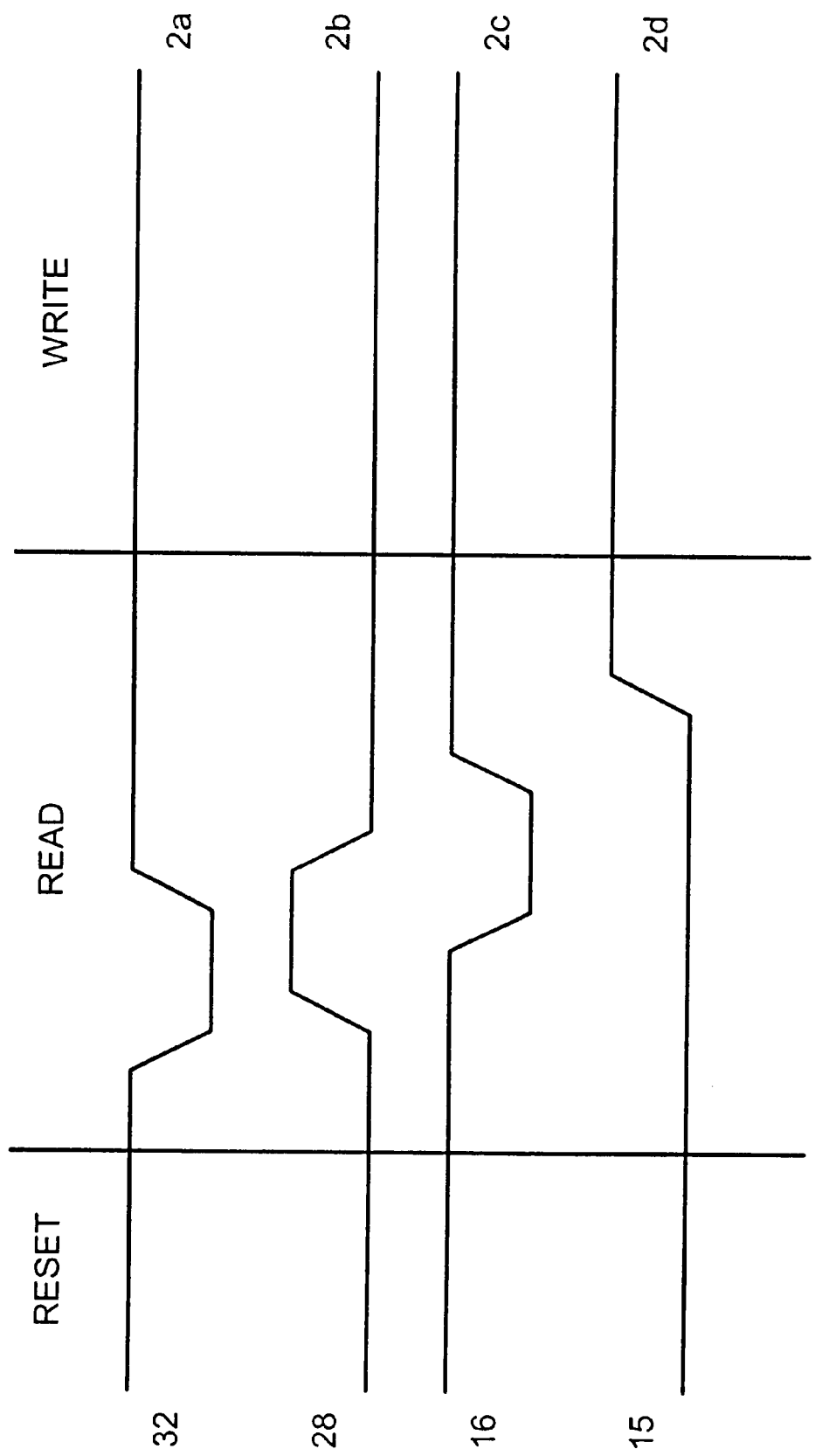
FIG. 2 shows a timing diagram for the sense amplifier of FIG. 1.

FIG. 2a shows the input at third input terminal 32 for the three sequential conditions of reset, read and write.

During the reset period, control input 32 is maintained at logic 1 with the consequence that, as shown in FIG. 2b the common tail node 28 of the first and second lower n-type transistors of the bistable circuitry 2 is maintained at a logic 0, thus allowing the bistable circuitry 2 to be in an active condition. The input at second control input 16, shown in FIG. 2c is at a logic 1 thus cutting off the third and fourth p-type transistors 13 and 14. The first control input 15 is maintained at a logic low level thus rendering the first p-type transistors active, but connection of the bit lines 10, 11 to the bistable circuitry 2 is prevented by the cut off transistors 13 and 14.

Thus during the reset period, no specific input is applied to the input/output terminals 20 and 21 of the bistable circuitry 2 which, assuming perfect matching will accordingly latch into a random state.

At the end of the reset cycle the third control input 32 drops to logic 0 causing the common node 28 to be driven high. Shortly afterwards the second control input 16 is driven low via the second inverter 17, thus rendering conductive the third and fourth p-type transistors 13 and 14. Hence the bit lines are coupled to the input/output nodes 20, 21 of the bistable circuitry 2. The differential voltage on the bit lines propagates to the input/output nodes 20,21 of the bistable circuitry 2. Shortly afterwards the second control input 16 returns to a high state and the common node 28 to a low state thus decoupling the bit lines from the bistable circuitry 2 and activating it to enable it to actively latch.

While the reset and read actions are taking place, the fourth control input 44 is maintained at a logic 0 with a result that the p-type transistor 47 of the output inverter and the n-type transistor 46 of the output inverter are both maintained off, tristating the output 50. However, once the input/output nodes 20, 21 of the bistable circuitry 2 have actively latched the fourth control input 44 will be allowed to rise to logic 1 such that the outputs of the NAND gates 42 and 43 have the same logic state as the corresponding input/output nodes 20, 21. As a result, either the upper transistor 47 or the lower transistor 46 of the output inverter will conduct, such that node 50 is at logic 1 or logic 0.

During a succeeding write cycle, the first control input 15 is at logic high and the second control input 16 is also at logic high, thus isolating the bistable circuitry 2 from the bit lines 10, 11. The bistable circuitry thus remains in the state in which it completed a previous read cycle.

From the above it will be seen that the bistable circuitry 2 is in its active state, namely with connection of both positive and negative supplies substantially all times except the period when the bit lines are connected to it. Disconnection of supplies is necessary to allow the voltage on the bit lines to set the amplifier, rather than the voltage on the amplifier set the bit lines.

The dimensions of the logic elements and the gating transistors is significant. For example, the first and second p-type buffer transistors 24 and 25 of the bistable circuitry 2 are dimensioned so as to restore logic 1 onto the "losing" side of the amplifier. The first and second lower n-type transistors 26 and 27 are relatively wide and of non minimum length.

The inverter 33 which is connected between the third control input 32 and the common node 28 has p-type devices sized to safely reset the amplifier in time, whereas the n devices are sized to keep the transistors in a low VGS state while evaluating. The inverter 17 is a small device having a low threshold voltage so that the input at second control input 16 is delayed until after the common node 28 has risen to logic 1, thus setting the bistable circuitry 2 to its unpowered condition.

Figure 3:
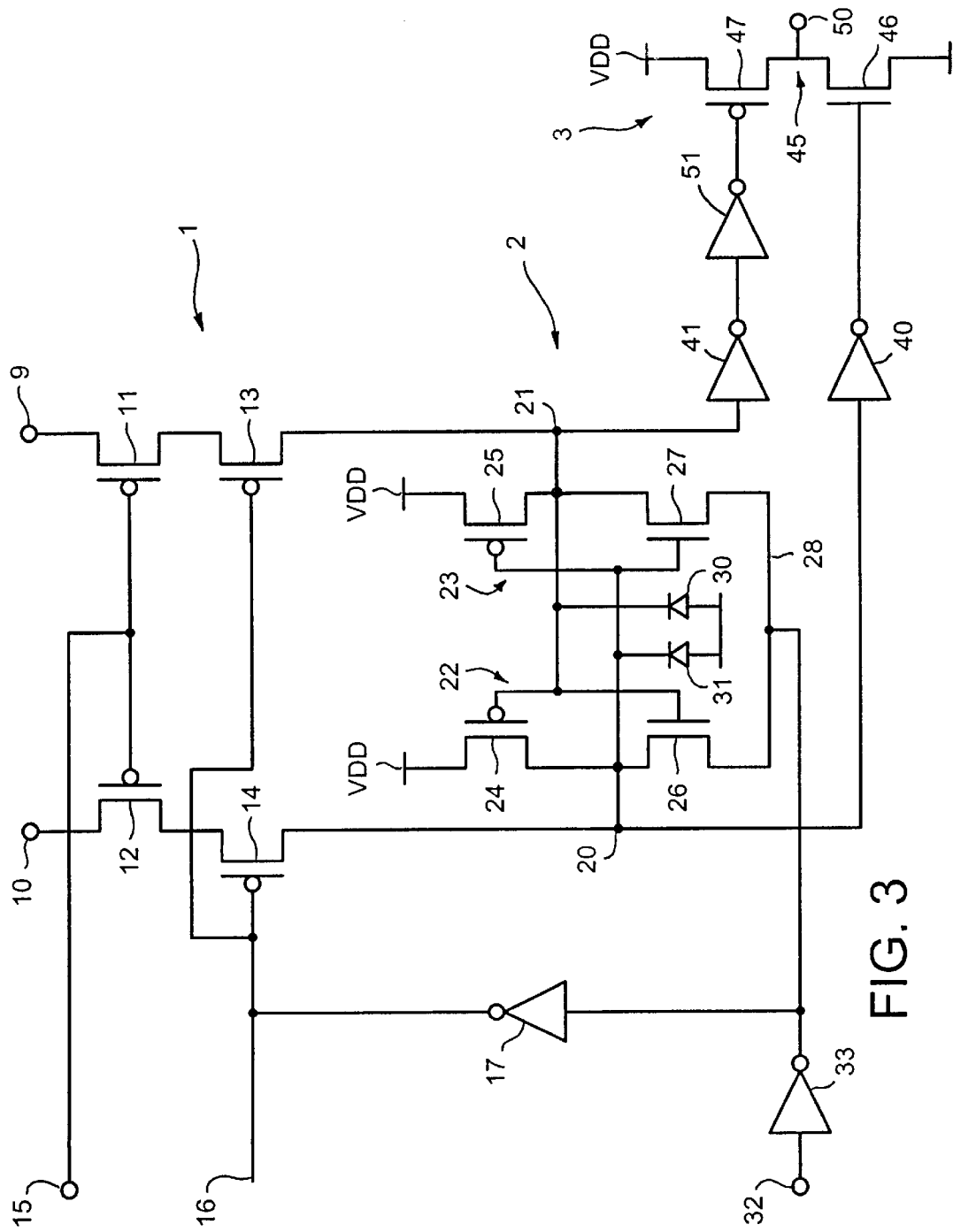
FIG. 3 shows a schematic diagram of a second embodiment of a sense amplifier in accordance with the invention.

A second embodiment of the invention will now be described with respect of FIG. 3. This circuit is similar to that described with respect to FIG. 1, except for the absence of the two NAND gates 42 and 43 and the succeeding inverters 48 and 49.

In operation, when the third control input 32 is at a low potential, two input/output nodes 20,21 of the bistable circuitry will be at a high potential due to the connection to the positive voltage supply of the two P-type transistors 24 and 25 of the bistable circuitry. As a result, the gate of P type transistor 47 of the output circuitry 45 will be at a high potential due to the series inverters 41 and 51, thus rendering the P type transistor nonconductive. Likewise, due to the action of the inverter 40 the gate potential of the N type transistor 46 will be at a low potential thus rendering the N type transistor non-conductive. It will therefore be seen that for the brief period during which the third control input 32 is at a low potential the output terminal 50 of the circuit is tristated by virtue of the two driving transistors 46 and 47 being turned off. This has the effect of preventing "dirty" transitions.

What is claimed is:

1. A sense amplifier circuit for sensing a potential difference between two input lines, and for adopting a first or second logic state in response to said potential difference being respectively positive or negative, the sense amplifier comprising a bistable circuit, a control circuit and a gating circuit, said gating circuit having a gating circuit input terminal, and said control circuit having a control input and an output, wherein the bistable circuit has a first and a second signal terminal connected to the input lines via said gating circuit, wherein said bistable circuit has positive and negative supply nodes, one of said supply nodes being connected to a respective one of a positive and negative supply terminals and the other of said supply nodes being connected to the output of said control circuit, said control circuit operating in response to an input at said control input to activate said bistable circuit, and further comprising a delaying inverter circuit connecting the output of said control circuit to said gating circuit input terminal.

2. The sense amplifier of claim 1 wherein the bistable circuit comprises a pair of cross-coupled CMOS inverters.

3. The sense amplifier of claim 2 wherein the CMOS inverters comprise respective PMOS transistors having a connection to a positive supply rail and NMOS transistors having a connection to said control circuit for providing a negative supply thereto.

4. The sense amplifier of claim 1 having first and second output terminals, further comprising an output circuit, said output circuit comprising a P-type transistor and an N-type transistor having a common output node, and each having a respective control terminal wherein the control terminal of said P-type transistor is connected to said first output terminal and the control terminal of said N-type transistor is connected to said second output terminal.

5. The sense amplifier of claim 4 further comprising circuitry connected between said sense amplifier output terminals and said output circuit for simultaneously rendering said P-type and N-type transistors of said output circuit non-conductive.

6. The sense amplifier of claim 5 wherein said circuitry comprises at least one inverter connected between the second output terminal of said sense amplifier and the control terminal of the N-type transistor, wherein said bistable circuit has said connection to a positive supply whereby when said control circuit is operated to disconnect said bistable circuit from said negative supply, said P-type and N-type transistors of said output circuit are non-conductive.

7. The sense amplifier circuit of claim 5 wherein said circuitry comprises gating circuitry having a further control input and connected between said output terminals and said P-type and N-type transistors of said output circuitry, said gating circuitry being operated by said further control input to render said P-type and N-type transistors of said output circuit nonconductive.

8. A method of operating a sense amplifier having a sensing circuit and a control circuit, said sensing circuit having a positive and a negative supply node, said control circuit having an output, wherein one of said positive and negative supply nodes is connected to the output of the control circuit, comprising:

connecting a sensing circuit to two input lines, whereby differential voltage on said input lines propagates to said sensing circuit;

disconnecting said input lines from said sensing circuit;

operating said control circuit to supply power to one supply whereby said sensing circuit latches; and continuing to operate said control circuit thereby maintaining said supply to said one supply node substantially at all times except during said connecting step.

9. A method of operating a sense amplifier as claimed in claim 8 wherein said step of connecting said sensing circuit to a power supply is started before starting said step of disconnecting said input line from said sensing circuit.

\* \* \* \* \*